（12）United States Patent
Shimmura et al.

(10) Patent No.: US 11,235,350 B2
(45) Date of Patent: Feb. 1, 2022

(54) SOLUTION TREATMENT APPARATUS AND CLEANING METHOD FOR SOLUTION TREATMENT APPARATUS

(71) Applicant: Tokyo Electron Limited, Tokyo (JP)

(72) Inventors: Satoshi Shimmura, Koshi (JP); Yuji Sakai, Koshi (JP); Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 25 days.

(21) Appl. No.: 16/266,310

(22) Filed: Feb. 4, 2019

(65) Prior Publication Data

US 2019/0255561 A1 Aug. 22, 2019

(30) Foreign Application Priority Data

Feb. 16, 2018 (JP) .............................. JP2018-025955

(51) Int. Cl.
| | |
|---|---|
| *B05C 21/00* | (2006.01) |
| *B08B 9/08* | (2006.01) |
| *B05C 5/02* | (2006.01) |
| *G03F 7/16* | (2006.01) |
| *H01L 21/67* | (2006.01) |
| *B05C 11/10* | (2006.01) |

(52) U.S. Cl.
CPC ................ *B05C 21/00* (2013.01); *B05C 5/02* (2013.01); *B08B 9/08* (2013.01); *G03F 7/162* (2013.01); *H01L 21/6715* (2013.01); *B05C 11/1039* (2013.01)

(58) Field of Classification Search
CPC ....... B05C 21/00; B05C 5/02; B05C 11/1039; G03F 7/162
See application file for complete search history.

(56) References Cited

U.S. PATENT DOCUMENTS 4,393,807 A * 7/1983 Fujimura ................ G03F 7/162
  118/320
5,677,000 A * 10/1997 Yoshioka ............ H01L 21/6715
  427/240

(Continued)

FOREIGN PATENT DOCUMENTS

| JP | S63-260025 A | 10/1988 |
|---|---|---|
| JP | 3175893 U | 6/2012 |
| JP | 2016-184644 A | 10/2016 |

*Primary Examiner* — Dah-Wei D. Yuan
*Assistant Examiner* — Stephen A Kitt
(74) *Attorney, Agent, or Firm* — Posz Law Group, PLC

(57) ABSTRACT

A solution treatment apparatus includes: a substrate holding unit holds and rotates a substrate; a coating solution supply unit applies a coating solution to the substrate held by the substrate holding unit; a cup unit arranged outside the substrate holding unit in a manner to be able to surround the substrate held by the substrate holding unit; an exhaust path provided between the substrate holding unit and an inner peripheral surface of the cup unit; a coating solution collection unit provided above the exhaust path in a manner to cover the exhaust path and including an opening part communicating in a vertical direction; a solvent supply unit supplies a solvent for the coating solution to the coating solution collection unit; and a relay unit located above the coating solution collection unit and projecting from the inner peripheral surface of the cup unit toward the coating solution collection unit.

9 Claims, 9 Drawing Sheets

(56) References Cited

U.S. PATENT DOCUMENTS

| | | | | |
|---|---|---|---|---|
| 5,908,661 A * | 6/1999 | Batcheldor | ............. | B05C 11/08 |
| | | | | 427/240 |
| 6,033,728 A * | 3/2000 | Kikuchi | .................. | G03F 7/162 |
| | | | | 427/240 |
| 6,527,860 B1 * | 3/2003 | Yoshihara | ........... | H01L 21/6715 |
| | | | | 118/50 |
| 2005/0181127 A1 * | 8/2005 | Hamada | .............. | H01L 21/6715 |
| | | | | 427/240 |
| 2014/0030423 A1 * | 1/2014 | Kubota | .................. | B05C 11/08 |
| | | | | 427/8 |

* cited by examiner

SOLUTION TREATMENT APPARATUS AND CLEANING METHOD FOR SOLUTION TREATMENT APPARATUS

CROSS REFERENCE TO RELATED APPLICATIONS

This application is based upon and claims the benefit of priority of the prior Japanese Patent Application No. 2018-25955, filed in Japan on Feb. 16, 2018, the entire contents of which are incorporated herein by reference.

BACKGROUND OF THE INVENTION

1. Field of the Invention

The present invention relates to a solution treatment apparatus for applying a coating solution to a substrate and a cleaning method for the solution treatment apparatus.

2. Description of the Related Art

For example, in a photolithography process of a manufacturing process of a semiconductor device, a coating treatment of applying a predetermined coating solution onto, for example, a semiconductor wafer (hereinafter, referred to as a "wafer") as a substrate to form a coating film such as an anti-reflection film or a resist film is performed.

In the above-described coating treatment, a so-called spin coating method is widely used which supplies the coating solution from a nozzle to the wafer during rotation to diffuse the coating solution on the wafer by the centrifugal force to thereby form a coating film on the wafer. In a rotation-type solution treatment apparatus for performing the spin coating method, a container called a cup is provided for preventing the coating solution scattered from the front surface of the rotated wafer from scattering to the surroundings. Further, exhaust from the bottom part of the cup is performed to prevent the coating solution, which is scattered from the edge portion of the wafer to be formed into mist and fly to above the cup, from contaminating the outside of the cup when the wafer is rotated.

In recent years, it is sometimes required to form a coating film with a large thickness on the wafer using a coating solution such as a resist solution with high viscosity. In the case of the coating solution with high viscosity, when the coating solution is diffused by rotating the wafer after applied thereon, a part of the coating solution is shaken off from the end portion of the wafer and solidified in a threadlike state and the coating solution solidified in the threadlike state (hereinafter, referred to also as a "threadlike foreign substance") or a flocculent foreign substance made of entangled threadlike foreign substances clogs in an exhaust path in some cases. In such a case, the desired exhaust pressure cannot be obtained and the outside of the cup is contaminated with, for example, the coating solution in the mist state.

In contrast to the above, a solution treatment apparatus of Japanese Utility Model Registration No. 3175893, a collection member in a mesh shape is provided above an exhaust path, which is provided between a rotation and holding unit configured to hold and rotate a wafer and an inner peripheral surface of a cup, in a manner to cover the exhaust path to collect the threadlike foreign substance and the flocculent foreign substance by the collection member. Then, after the step of forming a coating film or the like, a solvent for dissolving the threadlike foreign substance is supplied to the collection member at a collection member cleaning step to remove the threadlike foreign substance and the flocculent foreign substance.

SUMMARY OF THE INVENTION

However, in the method disclosed in Japanese Utility Model Registration No. 3175893, in addition to the step essential to form the coating film, the collection member cleaning step is required, and the collection member cleaning step takes much time, and therefore there is room for improvement in terms of productivity. In particular, in the case of using the coating solution with high viscosity, a drying step for the coating film and so on require much time as compared with the case of using the coating solution with low viscosity, and the improvement regarding the productivity is strongly required.

A technique according to this disclosure has been made in consideration of the points and removes the foreign substance generated in rotation coating without degrading the productivity in a solution treatment apparatus for applying a coating solution on a substrate by a so-called rotation-type as described above.

One aspect of the technique according to this disclosure is a solution treatment apparatus for applying a coating solution onto a substrate, the solution treatment apparatus includes: a substrate holding unit configured to hold and rotate the substrate; a coating solution supply unit configured to apply the coating solution to the substrate held by the substrate holding unit; a cup unit arranged outside the substrate holding unit in a manner to be able to surround the substrate held by the substrate holding unit; an exhaust path provided between the substrate holding unit and an inner peripheral surface of the cup unit; a coating solution collection unit provided above the exhaust path in a manner to cover the exhaust path and including an opening part communicating in a vertical direction; a solvent supply unit configured to supply a solvent for the coating solution to the coating solution collection unit; and a relay unit located above the coating solution collection unit and projecting from the inner peripheral surface of the cup unit toward the coating solution collection unit.

According to the one aspect of the technique according to this disclosure, the relay unit projecting from the inner peripheral surface of the cup unit toward the coating solution collection unit is provided above the coating solution collection unit, so that the solvent shaken off from the rotated substrate in the substrate back surface cleaning and the edge (peripheral portion) cleaning bumps into the relay unit and the cup unit and is dripped to the coating solution collection unit via the relay unit. Accordingly, the threadlike foreign substance of the resist solution collected by the coating solution collection unit can be dissolved with the solvent in the substrate back surface cleaning and the edge cleaning. In other words, the threadlike foreign substance can be removed without degrading the productivity.

One aspect of the technique according to this disclosure in another viewpoint is a cleaning method for a solution treatment apparatus for applying a coating solution onto a substrate, the solution treatment apparatus including: a substrate holding unit configured to hold and rotate the substrate; a coating solution supply unit configured to apply the coating solution to the substrate held by the substrate holding unit; a cup unit arranged outside the substrate holding unit in a manner to be able to surround the substrate held by the substrate holding unit; an exhaust path provided between the substrate holding unit and an inner peripheral surface of the cup unit; a coating solution collection unit provided above the exhaust path in a manner to cover the exhaust path and including an opening part communicating in a vertical direction; a solvent supply unit configured to supply a solvent for the coating solution to the coating solution collection unit; and a relay unit located above the coating solution collection unit and projecting from the inner peripheral surface of the cup unit toward the coating solution collection unit, the cleaning method including a drip step of supplying the solvent supplied from the solvent supply unit to the substrate rotated by the substrate holding unit, shaking off the solvent from the rotated substrate, and causing the solvent to bump into the relay unit and drip onto the coating solution collection unit.

According to the one aspect of the technique according to this disclosure, the foreign substance generated in the rotation coating of the coating solution can be removed without degrading the productivity.

DETAILED DESCRIPTION OF THE INVENTION

Hereinafter, embodiments of the present invention will be explained. Note that in the description and the drawings, the same codes are given to components having substantially the same functional configurations to omit duplicated explanation.

Figure 1:
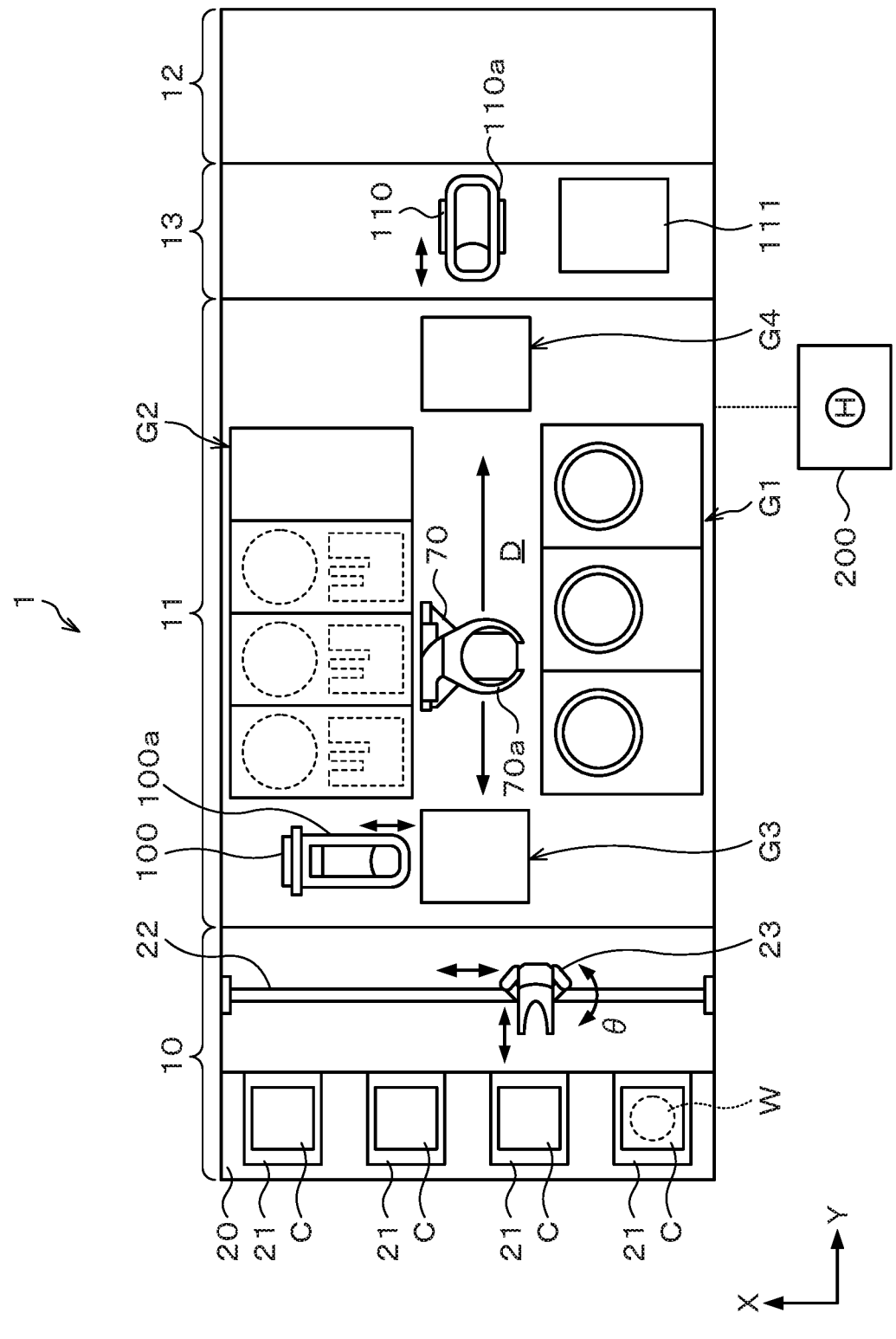
FIG. 1 is a plan view illustrating the outline of a configuration of a substrate treatment system equipped with a solution treatment apparatus according to this embodiment.
Figure 2:
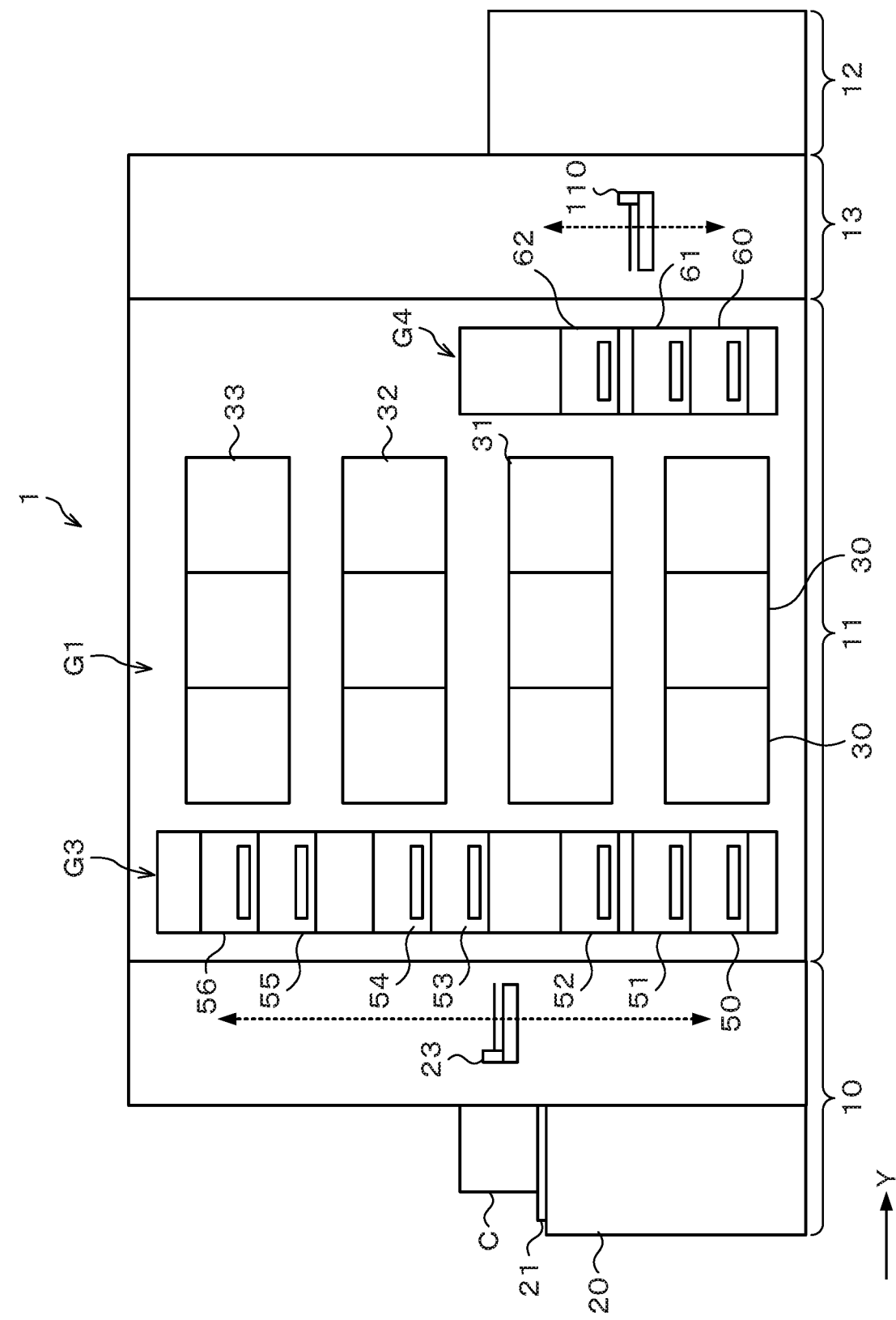
FIG. 2 is a front view illustrating the outline of the configuration of the substrate treatment system equipped with the solution treatment apparatus according to this embodiment.
Figure 3:
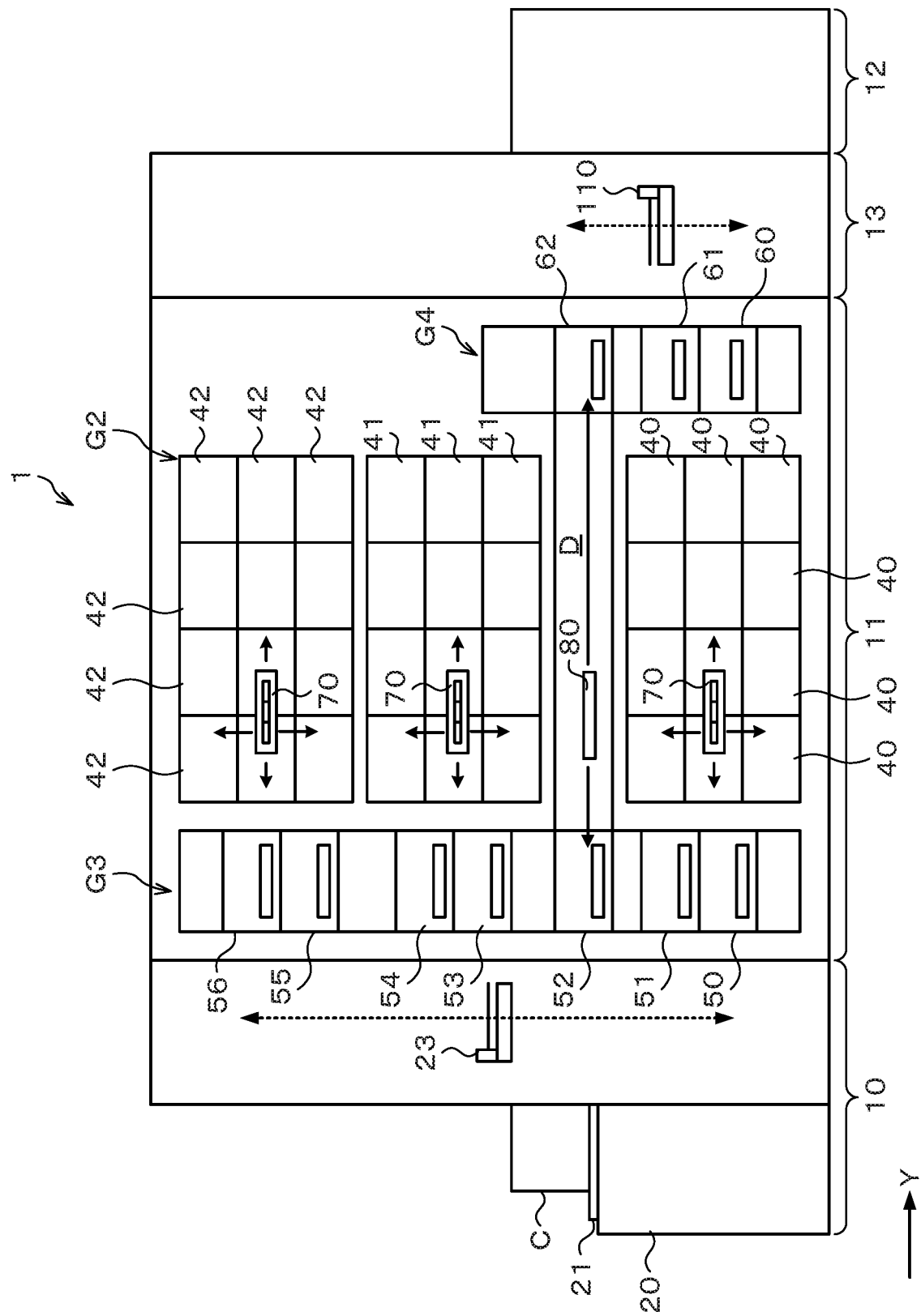
FIG. 3 is a rear view illustrating the outline of the configuration of the substrate treatment system equipped with the solution treatment apparatus according to this embodiment.

FIG. 1 is an explanatory view illustrating the outline of the configuration of a substrate treatment system 1 equipped with a solution treatment apparatus according to this embodiment. FIG. 2 and FIG. 3 are a front view and a rear view schematically illustrating the outline of the internal configuration of the substrate treatment system 1, respectively. Note that the solution treatment apparatus according to this embodiment is a resist coating apparatus that applies a resist solution as a coating solution onto a substrate hereinafter.

The substrate treatment system 1 has, as illustrated in FIG. 1, a configuration in which a cassette station 10 into/out of which a cassette C housing a plurality of wafers W is transferred, a treatment station 11 which includes a plurality of various treatment apparatuses performing predetermined treatments on the wafer W, and an interface station 13 which delivers the wafer W to/from an exposure apparatus 12 adjacent to the treatment station 11, are integrally connected.

In the cassette station 10, a cassette mounting table 20 is provided. The cassette mounting table 20 is provided with a plurality of cassette mounting plates 21 on which the cassettes C are mounted when the cassettes C are transferred in/out from/to the outside of the substrate treatment system 1.

In the cassette station 10, a wafer transfer apparatus 23 is provided which is movable on a transfer path 22 extending in an X-direction as illustrated in FIG. 1. The wafer transfer apparatus 23 is movable also in a vertical direction and around a vertical axis (in a θ-direction), and can transfer the wafer W between the cassette C on each of the cassette mounting plates 21 and a later-described delivery apparatus in a third block G3 in the treatment station 11.

In the treatment station 11, a plurality of, for example, four blocks G1, G2, G3, G4 are provided each including various apparatuses. For example, the first block G1 is provided on the front side (X-direction negative direction side in FIG. 1) in the treatment station 11, and the second block G2 is provided on the rear side (X-direction positive direction side in FIG. 1) in the treatment station 11. Further, the third block G3 is provided on the cassette station 10 side (Y-direction negative direction side in FIG. 1) in the treatment station 11, and the fourth block G4 is provided on the interface station 13 side (Y-direction positive direction side in FIG. 1) in the treatment station 11.

For example, in the first block G1, as illustrated in FIG. 2, a plurality of solution treatment apparatuses, for example, developing treatment apparatuses 30 each of which performs a developing treatment on the wafer W, lower anti-reflection film forming apparatuses 31 each of which forms an anti-reflection film (hereinafter, referred to as a "lower anti-reflection film") at a lower layer of a resist film of the wafer W, resist coating apparatuses 32 each of which applies a resist solution to the wafer W to form a resist film, and upper anti-reflection film forming apparatuses 33 each of which forms an anti-reflection film (hereinafter, referred to as an "upper anti-reflection film") at an upper layer of the resist film of the wafer W, are arranged in this order from the bottom.

For example, the developing treatment apparatus 30, the lower anti-reflection film forming apparatus 31, the resist coating apparatus 32, and the upper anti-reflection film forming apparatus 33 are arranged three each side by side in the horizontal direction. Note that the numbers and the arrangement of the developing treatment apparatuses 30, the lower anti-reflection film forming apparatuses 31, the resist coating apparatuses 32, and the upper anti-reflection film forming apparatuses 33 can be arbitrarily selected.

In each of the developing treatment apparatus 30, the lower anti-reflection film forming apparatus 31, the resist coating apparatus 32, and the upper anti-reflection film forming apparatus 33, for example, spin coating of applying a predetermined coating solution onto the wafer W is performed. In the spin coating, the coating solution is discharged, for example, from a coating nozzle onto the wafer W and the wafer W is rotated to diffuse the coating solution over the front surface of the wafer W. Note that the configuration of the resist coating apparatus 32 will be described later.

For example, in the second block G2, as illustrated in FIG. 3, thermal treatment apparatuses 40 each of which performs thermal treatments such as heating and cooling on the wafer W, adhesion apparatuses 41 each for enhancing adhesion between the resist solution and the wafer W, and edge exposure apparatuses 42 each of which exposes the outer peripheral portion of the wafer W, are provided side by side in the vertical direction and in the horizontal direction. The numbers and the arrangement of the thermal treatment apparatuses 40, the adhesion apparatuses 41, and the edge exposure apparatuses 42 can also be arbitrarily selected.

For example, in the third block G3, a plurality of delivery apparatuses 50, 51, 52, 53, 54, 55, 56 are provided in order from the bottom. Further, in the fourth block G4, a plurality of delivery apparatuses 60, 61, 62 are provided in order from the bottom.

A wafer transfer region D is formed in a region surrounded by the first block G1 to the fourth block G4 as illustrated in FIG. 1. In the wafer transfer region D, for example, a plurality of wafer transfer apparatuses 70 are arranged each of which has a transfer arm 70a movable, for example, in the Y-direction, the X-direction, the θ-direction, and the vertical direction. The wafer transfer apparatus 70 can move in the wafer transfer region D to transfer the wafer W to a predetermined apparatus in the first block G1, the second block G2, the third block G3 and the fourth block G4 therearound.

Further, in the wafer transfer region D, a shuttle transfer apparatus 80 is provided which linearly transfers the wafer W between the third block G3 and the fourth block G4.

The shuttle transfer apparatus 80 is configured to be linearly movable, for example, in the Y-direction in FIG. 3. The shuttle transfer apparatus 80 can move in the Y-direction while supporting the wafer W, and transfer the wafer W between the delivery apparatus 52 in the third block G3 and the delivery apparatus 62 in the fourth block G4.

As illustrated in FIG. 1, a wafer transfer apparatus 100 is provided adjacent on the X-direction positive direction side of the third block G3. The wafer transfer apparatus 100 has a transfer arm 100a that is movable, for example, in the X-direction, the θ-direction, and the vertical direction. The wafer transfer apparatus 100 can move up and down while supporting the wafer W by the transfer arm 100a to transfer the wafer W to each of the delivery apparatuses in the third block G3.

In the interface station 13, a wafer transfer apparatus 110 and a delivery apparatus 111 are provided. The wafer transfer apparatus 110 has a transfer arm 110a that is movable, for example, in the Y-direction, the θ-direction, and the vertical direction. For example, the wafer transfer apparatus 110 can transfer the wafer W to/from each of the delivery apparatuses in the fourth block G4, the delivery apparatus 111, and the exposure apparatus 12 while supporting the wafer W by the transfer arm 110a.

In the above substrate treatment system 1, a control unit 200 is provided as illustrated in FIG. 1. The control unit 200 is, for example, a computer and includes a program storage unit (not illustrated). In the program storage unit, a program for controlling the treatments on the wafer W in the substrate treatment system 1 is stored. Further, programs for controlling the operations of the above-described various treatment apparatuses and the drive system such as the transfer apparatuses to realize a later-described coating treatment in the substrate treatment system 1 is also stored in the program storage unit. Note that the programs may be the one that is recorded, for example, in a computer-readable storage medium H such as a computer-readable hard disk (HD), flexible disk (FD), compact disk (CD), magneto-optical disk (MO), or memory card, and installed from the storage medium into the control unit 200.

Figure 4:
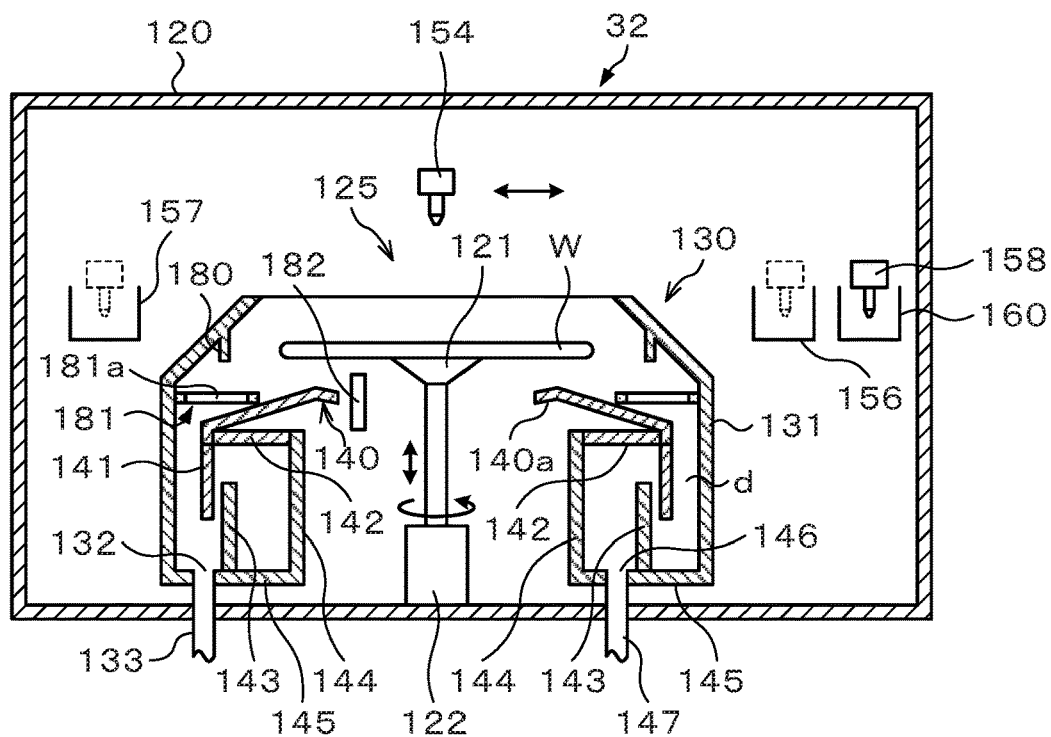
FIG. 4 is a longitudinal sectional view illustrating the outline of the configuration of a resist coating apparatus.
Figure 5:
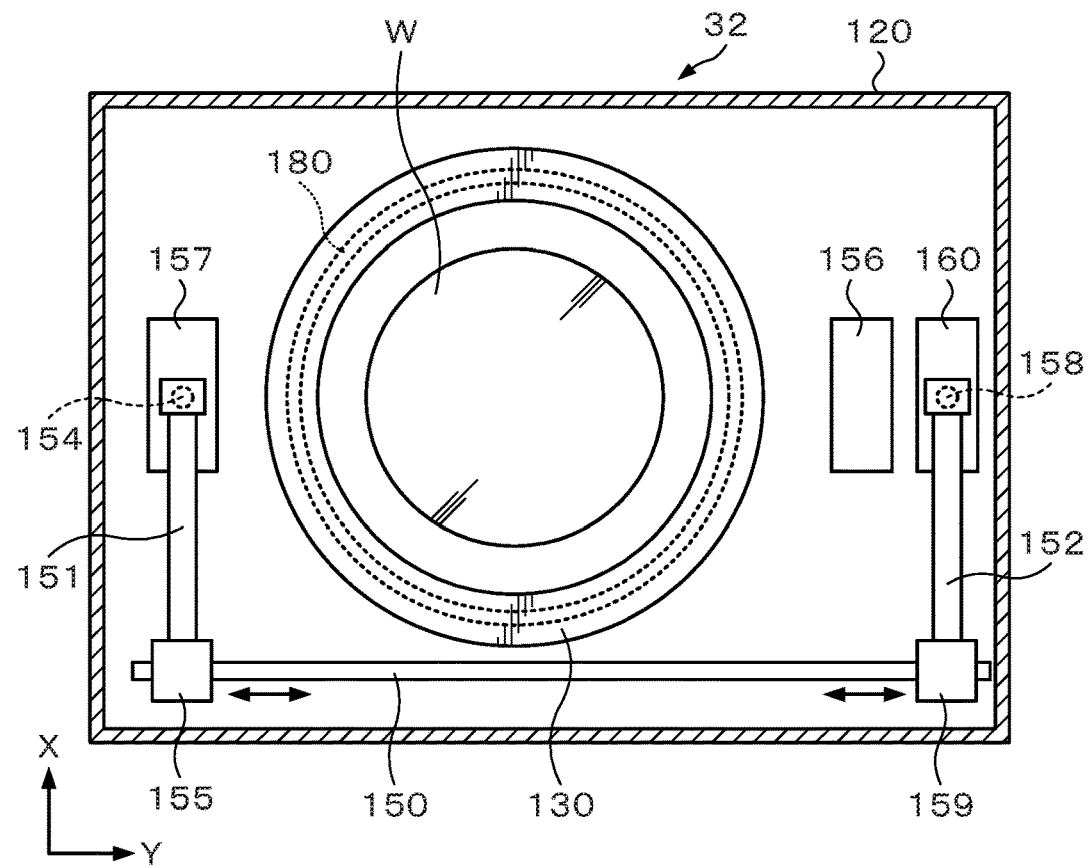
FIG. 5 is a transverse sectional view illustrating the outline of the configuration of the resist coating apparatus.
Figure 6:
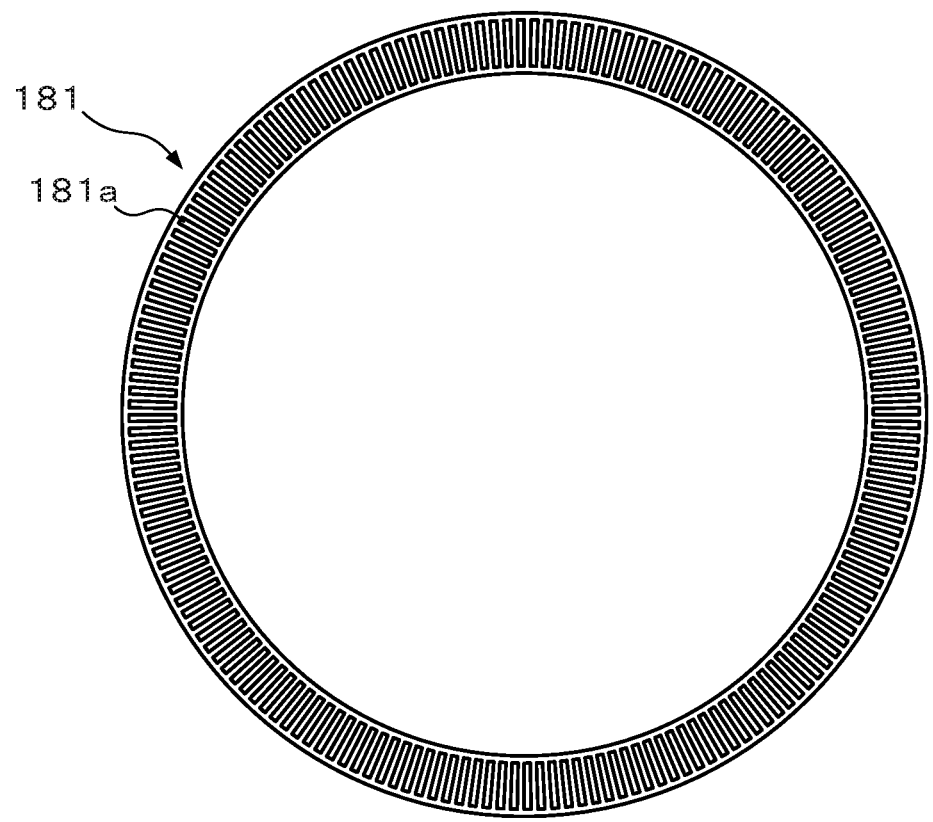
FIG. 6 is a plan view illustrating the outline of a collection member provided in the resist coating apparatus.
Figure 7:
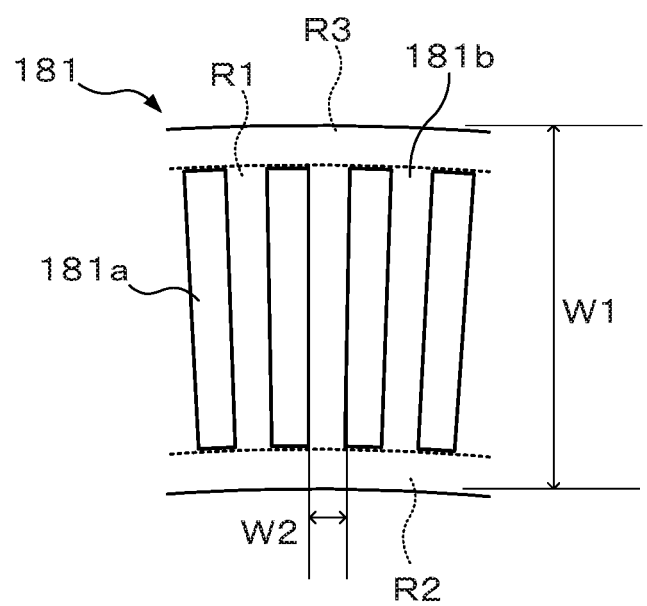
FIG. 7 is a partially enlarged view of FIG. 6.
Figure 8:
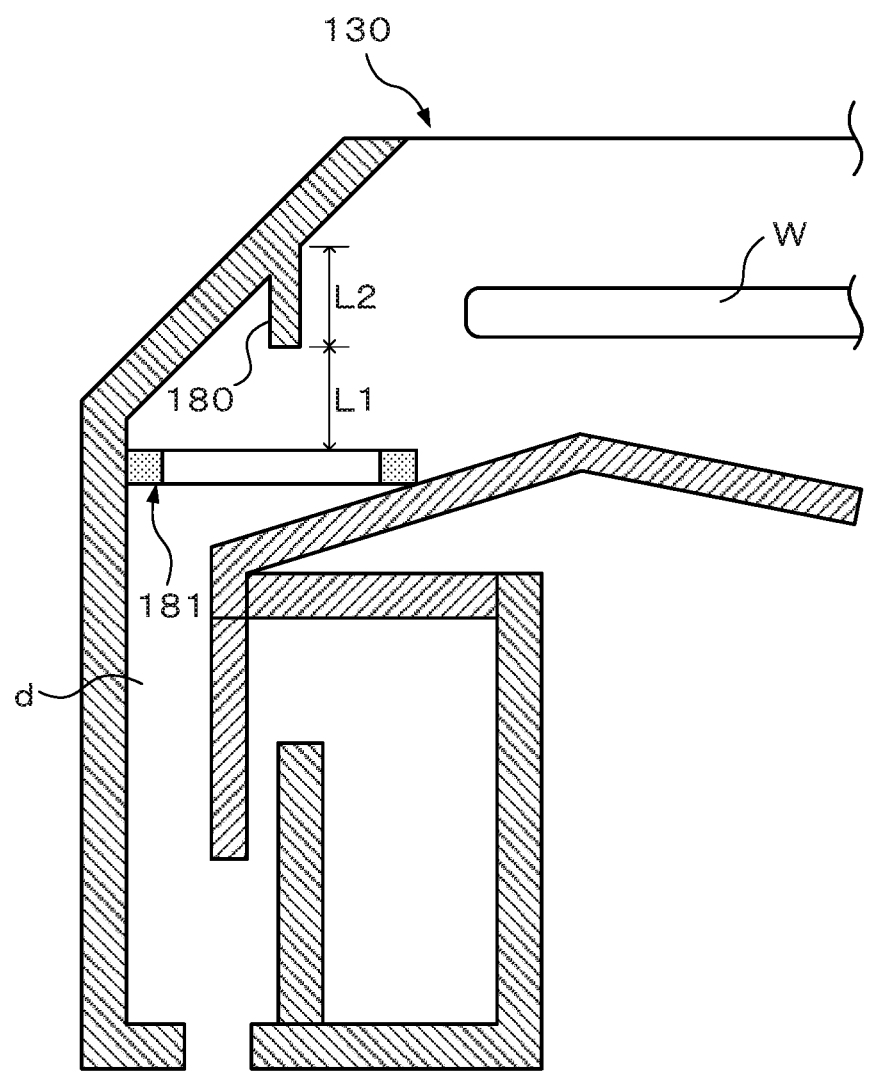
FIG. 8 is a partially enlarged view of FIG. 4.

Subsequently, the configuration of the above-described resist coating apparatus 32 will be described. FIG. 4 and FIG. 5 are a longitudinal sectional view and a transverse sectional view illustrating the outline of the configuration of the resist coating apparatus 32, respectively. FIG. 6 is a plan view illustrating the outline of a collection member provided in the resist coating apparatus 32. FIG. 7 is a partially enlarged view of FIG. 6. FIG. 8 is a partially enlarged view of FIG. 4.

The resist coating apparatus 32 has a treatment container 120 whose inside can be closed as illustrated in FIG. 4 and FIG. 5. A side surface of the treatment container 120 is formed with a transfer-in/out port (not illustrated) for the wafer W.

In the treatment container 120, a spin chuck 121 is provided as a substrate holding unit which holds and rotates the wafer W. The spin chuck 121 can rotate at a predetermined speed by a chuck drive unit 122 such as a motor. Further, the chuck drive unit 122 is provided with a raising and lowering drive mechanism such as a cylinder so that the spin chuck 121 can freely rise and lower.

In the treatment container 120, a cup 125 as a cup unit which accommodates the spin chuck 121 and evacuated from a bottom part is provided. The cup 125 includes an outer cup 130 arranged outside the spin chuck 121 in a manner to be able to surround the substrate held by the spin chuck 121 and an inner cup 140 located on an inner peripheral side of the outer cup 130. The outer cup 130 is to receive and collect liquid splashing or dropping from the wafer W.

As illustrated in FIG. 5, on an X-direction negative direction (lower direction in FIG. 5) side of the outer cup 130, a rail 150 is formed which extends along a Y-direction (right-left direction in FIG. 5). The rail 150 is formed, for example, from a Y-direction negative direction (left direction in FIG. 5) side outer position to a Y-direction positive direction (right direction in FIG. 5) side outer position of the outer cup 130. To the rail 150, two arms 151, 152 are provided.

On the first arm 151, a resist solution supply nozzle 154 as a coating solution supply unit which supplies the resist solution as the coating solution is supported. The resist solution supplied from the resist solution supply nozzle 154 has a high viscosity of 50 cP or more. The first arm 151 is movable on the rail 150 by means of a nozzle drive unit 155 as a moving mechanism. This allows the resist solution supply nozzle 154 to move from a waiting section 156 provided at the Y-direction positive direction side outer position of the outer cup 130 to a waiting section 157 provided at the Y-direction negative direction side outer side of the outer cup 130 through a position above a center portion of the wafer W in the outer cup 130. Further, the first arm 151 freely rises and lowers by means of the nozzle drive unit 155 to be able to adjust the height of the resist solution supply nozzle 154.

On the second arm 152, a solvent supply nozzle 158 is supported which supplies an organic solvent such as a thinner onto the wafer W. The second arm 152 is movable on the rail 150 by means of a nozzle drive unit 159 as a moving mechanism. This allows the solvent supply nozzle 158 to move from a waiting section 160 provided on the Y-direction positive direction side outer side of the outer cup 130 to a position above the center portion of the wafer W in the outer cup 130. The waiting section 160 is provided on the Y-direction positive direction side of the waiting section 156. Further, the second arm 152 freely rises and lowers by means of the nozzle drive unit 159 to be able to adjust the height of the solvent supply nozzle 158.

The organic solvent supplied from the solvent supply nozzle 158 functions as a prewetting agent supplied onto the wafer W in a prewet treatment performed before application of the resist solution, for facilitating diffusion of the resist solution on the wafer W. Further, as will be described later, the organic solvent from the solvent supply nozzle 158 is shaken off from the wafer W in the prewet treatment and dripped onto a later-described collection member 181 via a later-described relay unit 180. This enables the organic solvent to dissolve a linear foreign substance and a flocculent foreign substance of the resist solution which are generated from the wafer W and collected by the collection member 181. In short, the solvent supply nozzle 158 functions as a solvent supply unit.

Further, at a portion between the inner cup 140 and the spin chuck 121, a back rinse solution supply nozzle 182 is provided which supplies an organic solvent such as a thinner onto a back surface of the wafer W. The organic solvent supplied from the back rinse solution supply nozzle 182 is supplied to an end part on the back side of the wafer W in order to prevent the resist solution from going around to the back surface side of the wafer W in diffusing the resist solution onto the wafer W.

An annular wall body 131 is provided at the lower part of the outer cup 130, and an annular wall body 141 is provided at the lower part of the inner cup 140. Between the annular wall bodies 131 and 141, a gap forming an exhaust path d is formed. Furthermore, a circular horizontal member 142, cylindrical outer peripheral vertical member 143 and inner peripheral vertical member 144, a circular bottom surface member 145 located at the bottom part form a zigzagging path at the bottom of the inner cup 140. The zigzagging path constitutes a gas/liquid separation unit.

Further, a drain port 132 which drains collected liquid is formed in the bottom surface member 145 between the wall body 131 and the outer peripheral vertical member 143, and a drain pipe 133 is connected to the drain port 132.

An exhaust port 146 which exhausts the atmosphere around the wafer W is formed in the bottom surface member 145 between the outer peripheral vertical member 143 and the inner peripheral vertical member 144, and an exhaust pipe 147 is connected to the exhaust port 146.

Further, the collection member 181 as a coating solution collection unit is provided in the cup 125 in a manner to close the upper part of the exhaust path d provided between the above-described wall body 131 of the outer cup 130 and the wall body 141 of the inner cup 140. The collection member 181 is for collecting the threadlike foreign substance of the resist solution and made of metal such as SUS. Further, the collection member 181 closes the exhaust path d as described above, but has opening parts 181a communicating in the vertical direction so that air can be exhausted through the opening parts 181a.

Further, the collection member 181 is provided in the cup 125 such that its upper surface is almost horizontal. The collection member 181 is, for example, a circular member in a plan view as illustrated in FIG. 6 and FIG. 7, and the opening parts 181a are provided to be arranged side by side at regular intervals on a circumference.

Further, as illustrated in FIG. 8, the relay unit 180 projecting from the inner peripheral surface of the outer cup 130 toward the collection member 181 is provided at a portion located above the collection member 181 of the above-described outer cup 130. The relay unit 180 is provided such that the lower end of the relay unit 180 is located above an opening formation region R1 (see FIG. 7) that is a region where the opening parts 181a are formed in the radial direction of the collection member 181. The lower end of the relay unit 180 is located below the lower surface of the wafer W held by the spin chuck 121 in a side view. Further, the relay unit 180 is formed in a circular shape in a plan view (see FIG. 5). Note that an upper inner peripheral surface of the outer cup 130 provided with the relay unit 180 is an inclined surface lower on the outer side than on the inner side in the radial direction.

Further, the collection member 181 is formed such that a portion different from the opening parts 181a linearly links a region on the innermost side (innermost peripheral region) R2 and a region on the outermost side (outermost peripheral region) R3 in a plan view of the collection member 181 as illustrated in FIG. 7. The above-described portion different from the opening parts 181a means a portion (bridge) 181b between opening parts 181a adjacent to each other in the circumferential direction. In other words, the collection member 181 has the bridge 181b which linearly links the innermost peripheral region R2 and the outermost peripheral region R3 of the collection member 181 between an opening part 181a and another opening part 181a adjacent to each other in the circumferential direction in the opening formation region R1.

Next, the wafer treatment performed using the substrate treatment system 1 configured as described above will be described. First, a cassette C housing a plurality of wafers W is transferred into the cassette station 10 of the substrate treatment system 1 and the wafers W in the cassette C are successively transferred by the wafer transfer apparatus 23 to the delivery apparatus 53 in the treatment station 11.

Then, the wafer W is transferred to the thermal treatment apparatus 40 in the second block G2 and temperature-regulated. Thereafter, the wafer W is transferred by the wafer transfer apparatus 70, for example, to the lower anti-reflection film forming apparatus 31 in the first block G1, in which a lower anti-reflection film is formed on the wafer W. The wafer W is then transferred to the thermal treatment apparatus 40 in the second block G2 and heated and temperature-regulated.

Then, the wafer W is transferred to the adhesion apparatus 41 and subjected to an adhesion treatment. The wafer W is then transferred to the resist coating apparatus 32 in the first block G1, in which a resist film is formed on the wafer W. The wafer W is then transferred to the thermal treatment apparatuses 40 and subjected to a pre-baking treatment. Note that in the pre-baking treatment, the same treatment as the thermal treatment after the formation of the lower anti-reflection film is performed, and the same treatment is performed also in later-described thermal treatment after the formation of the anti-reflection film, post-exposure baking treatment, and post-baking treatment. However, the thermal treatment apparatuses 40 used for the thermal treatments are different from each other.

Next, the wafer W is transferred to the upper anti-reflection film forming apparatus 33, in which an upper anti-reflection film is formed on the wafer W. The wafer W is then transferred to the thermal treatment apparatus 40, and heated and temperature-regulated. The wafer W is then transferred to the edge exposure apparatus 42 and subjected to edge exposure processing.

Thereafter, the wafer W is transferred to the exposure apparatus 12 and subjected to exposure processing in a predetermined pattern.

Then, the wafer W is transferred to the thermal treatment apparatus 40 and subjected to a post-exposure baking treatment. The wafer W is then transferred to the developing treatment apparatus 30 and subjected to a developing treatment. After the developing treatment is finished, the wafer W is transferred to the thermal treatment apparatus 40 and subjected to a post-baking treatment. The wafer W is then transferred to the cassette C on the cassette mounting plate 21, with which a series of photolithography process is completed.

Here, the resist coating treatment in the resist coating apparatus 32 will be described in detail. For the coating treatment of the resist, first, the wafer W is sucked and held on the upper surface of the spin chuck 121. Then, the solvent supply nozzle 158 is moved to above the center portion of the wafer W and subjected to the prewet treatment. The action of the prewet treatment will be described later. Thereafter, the solvent supply nozzle 158 is retracted, and then the resist solution supply nozzle 154 is moved to above the center portion of the wafer W and the resist solution is supplied from the resist solution supply nozzle 154 onto the wafer W while the wafer W is being rotated at a low rotation speed (for example, 100 rpm).

Then, at the point in time when the supply amount of the resist solution from the resist solution supply nozzle 154 reaches a predetermined amount, the supply of the resist solution is stopped, and the resist solution supply nozzle 154 is then retracted. Thereafter, the wafer W is rotated at a higher rotation speed (for example, 3000 rpm) to perform a diffusion treatment of diffusing the resist solution supplied to the center portion of the wafer W over the entire surface of the wafer W to thereby form a coating film with a predetermined film thickness. Then, the wafer is rotated at a predetermined rotation speed (for example, 1000 rpm) to perform a drying treatment of drying the coating film on the wafer W.

Note that in the diffusion treatment and the drying treatment, the back rinse solution supply nozzle 182 supplies the solvent to the back surface of the rotated wafer W.

In the above-described diffusion treatment and drying treatment, the resist solution scatters to the surroundings from the upper surface of the wafer W sucked and held on the upper surface of the spin chuck 121 because the rotation speed of the wafer is high so as to be able to form a coating film with a small amount of resist solution though the viscosity of the resist solution is high. The scattered resist solution bumps into the relay unit 180, moves downward along the relay unit 180, drops from the lower end of the relay unit 180 to the collection member 181, and is collected. In this event, a part of the resist solution solidifies in a threadlike state because the resist solution has high viscosity and becomes a threadlike foreign substance. Incidentally, the resist solution scattered from the wafer W bumps into a portion above the relay unit 180 on the upper inner peripheral surface of the outer cup 130 in some cases. In these cases, the upper inner peripheral surface of the outer cup 130 is the inclined surface lower on the outer side in the radial direction as described above, so that the resist solution which bumps into the upper inner peripheral surface of the outer cup 130 moves along the inner peripheral surface and the relay unit 180, drops from the tip end of the relay unit 180 onto the collection member 181, and is collected by the collection member 181.

Since the formation of the coating film is completed by the above-described drying treatment, the wafer W sucked and held on the spin chuck 121 is transferred out of the resist coating apparatus 32, and the next wafer W is transferred thereinto. Subsequently, the next wafer W is subjected to the above-described prewet treatment. At a prewet step, the solvent supply nozzle 158 supplies the solvent onto the wafer W while the wafer W is being rotated at a high rotation speed (for example, 2000 rpm). Accordingly, the solvent scatters to the surroundings from the upper surface of the wafer W sucked and held on the upper surface of the spin chuck 121. The scattered solvent bumps into the relay unit 180, moves downward along the relay unit 180, and is dripped from the lower end of the relay unit 180 onto the threadlike foreign substance of the resist solution collected by the collection member 181. Incidentally, the solvent scattered from the wafer W bumps into the portion above the relay unit 180 on the upper inner peripheral surface of the outer cup 130 in some cases. In these cases, the upper inner peripheral surface of the outer cup 130 is the inclined surface lower on the outer side in the radial direction as described above, so that the solvent which bumps into the upper inner peripheral surface of the outer cup 130 moves along the inner peripheral surface and the relay unit 180, and is dripped from the tip end of the relay unit 180 onto the threadlike foreign substance of the resist solution collected by the collection member 181.

In this embodiment, the above-described relay unit 180 is provided above the collection member 181. Therefore, the threadlike foreign substance of the resist solution scattered from the wafer W and collected by the collection member 181 in the rotation coating onto the wafer W or the like can be dissolved and removed with the solvent applied in the prewet treatment and scattered from the wafer W and dripped via the relay unit 180. Accordingly, there is no need to separately perform a treatment for dissolving and removing the resist solution collected by the collection member 181, so that the throughput is never deteriorated.

Further, in a conventional cleaning method for a solution treatment apparatus, namely, a cleaning method for a collection member, it is difficult to control the collection position of the threadlike foreign substance of the resist solution at the collection member and the drip position of the solvent for dissolving the threadlike foreign substance at the collection member. Therefore, in some cases, it is difficult to appropriately remove the threadlike foreign substance. In contrast to this, in this embodiment, the relay unit 180 is provided and can thereby control the collection position of the threadlike foreign substance at the collection member 181 and the drip position of the solvent at the collection member 181 so as to appropriately dissolve and remove the threadlike foreign substance.

Further, in this embodiment, both the resist solution and the solvent drop/drip onto the collection member 181 via the relay unit 180, so that the drop position of the resist solution and the drip position of the solvent on the collection member 181 are the same. Accordingly, when the resist solution becomes the threadlike foreign substance, the foreign substance can be efficiently removed.

Note that the solidified resist solution is dissolved and removed using the solvent from the solvent supply nozzle 158 in the prewet treatment in this embodiment. In addition to or in place of the above, the solidified resist solution may be dissolved and removed using the solvent from the back rinse solution supply nozzle 182 in cleaning the back surface of the wafer W in the diffusion treatment, the drying treatment and the like. In the case where the rotation speed of the wafer is high in cleaning the back surface of the wafer W, the solvent supplied from the back rinse solution supply nozzle 182 to the back surface of the wafer W scatters from the back surface of the wafer W, bumps into the relay unit 180 or the upper inner peripheral surface of the outer cup 130, and is then dripped from the relay unit 180 onto the collection member 181. Accordingly, the solidified resist solution can be dissolved and removed also in back surface cleaning.

Further, the solidified resist solution may be dissolved and removed using the solvent from the solvent supply nozzle 158 in cleaning the edge peripheral portion of the wafer W.

The relay unit 180 provided to dissolve and remove the solidified resist solution is formed such that its low end is not in contact with the upper surface of the collection member 181 in this embodiment. Specifically, the relay unit 180 is formed such that a distance L1 (see FIG. 8) between the lower end of the relay unit 180 and the upper surface of the collection member 181 is larger than a length L2 (see FIG. 8) in the vertical direction of the relay unit 180. If the length L2 in the vertical direction of the relay unit 180 is too large, the solvent does not go around to the back side of the relay unit 180, namely, the side opposite to the spin chuck 121 of the relay unit 180 and an adhering matter may be accumulated on the back side. However, the relay unit 180 is provided to have the above-described dimension in this embodiment, so that the adhering matter is not accumulated on the back side. Note that the distance L1 between the lower end of the relay unit 180 and the upper surface of the collection member 181 is, for example, 14 mm or more.

Note that if a width W1 (see FIG. 7) in a radial direction of the collection member 181 is too small, the collection member 181 needs to have a large width W2 (see FIG. 7) in the circumferential direction of the opening part 181a in order to obtain mechanical strength while keeping the open area ratio so as to obtain a desired exhaust pressure, thus disabling collection of the solidified resist solution. Further, if the width W1 in the radial direction of the collection member 181 is too large, the solvent dripped onto the collection member 181 via the relay unit 180 does not sufficiently spread in the radial direction on the collection member 181, and therefore the solidified resist solution may remain without being dissolved. Accordingly, the width W1 in the radial direction of the collection member 181 is set to 14 mm or more and 29 mm or less. Note that the width W2 in the circumferential direction between the opening parts 181a in the collection member 181 is set to 1.5 mm or more and 3 mm or less. This is because if the width W2 is too large, the desired exhaust pressure cannot be obtained any longer, whereas if the width W2 is too small, the threadlike foreign substance of the resist solution cannot be collected by the collection member 181.

Further, if the open area ratio is too small, namely, the area of the opening parts 181a with respect to the entire collection member 181 in a plan view is too small, the solidified resist solution clogs too much in the opening parts 181a, and the desired exhaust pressure may not be obtained any longer. On the other hand, if the open area ratio is too large, the solidified resist solution cannot be collected, and the solidified resist solution cannot be removed. Accordingly, the open area ratio of the collection member 181 is set to 40% or more and 70% or less.

In addition, in this embodiment, the lower end of the collection member 181 is located below, in a side view, the lower surface of the wafer W held by the spin chuck 121 as described above. Accordingly, even in the case where the solvent from the solvent supply nozzle 158 is shaken off from the upper surface of the wafer W or in the case where the solvent from the back rinse solution supply nozzle 182 is shaken off from the lower surface of the wafer W when dripping the solvent onto the collection member 181 via the relay unit 180, the shaken off solvent can be made to more surely bump into the collection member 181 and be dripped to a predetermined place on the collection member 181.

Further, the relay unit 180 is configured such that the lower end of the relay unit 180 is located above the opening formation region R1 (see FIG. 7) of the collection member 181 as described above in this embodiment. Accordingly, the solvent dripped to the collection member 181 via the relay unit 180 appropriately spreads over the collection member 181, and thus can dissolve and remove the resist solution solidified and collected by the collection member 181.

Further, the collection member 181 has the bridge 181b linearly linking the innermost peripheral region R2 and the outermost peripheral region R3 of the collection member 181 between the opening part 181a and the other opening part 181a adjacent to each other in the circumferential direction in the opening formation region R1 as described above in this embodiment. Accordingly, the solvent dripped to the bridge 181b in the opening formation region R1 of the collection member 181 via the relay unit 180 does not drop from the opening parts 181a but naturally spreads to the innermost peripheral region R2 and the outermost peripheral region R3. Therefore, the collected resist solution can be dissolved and removed up to the innermost peripheral region R2 and the outermost peripheral region R3 of the collection member 181.

Note that the collection member 181 is provided in the cup 125 such that its upper surface is almost horizontal as described above in this embodiment. This is because in the case where the upper surface of the collection member 181 is not horizontal, namely, in the case where one side of the upper surface is lower, the solvent dripped onto the collection member 181 via the relay unit 180 flows to the lower side of the upper surface of the collection member 181 so that the threadlike foreign substance of the resist solution collected by a portion on the higher side cannot be dissolved and removed. Also in the case where the collection member 181 is configured such that the one end in the radial direction thereof is made higher and the solvent is dripped onto the portion, the amount of the solvent dropping downward from the opening before reaching the lower side on the other end becomes large, causing a portion where the solvent is difficult to dissolve and remove occurs at the end portion on the lower side. As described above, since the solvent is supplied using the treatment step on the substrate, increasing the supply amount and supply time of the solvent is not preferable in terms of production efficiency of products, and therefore a form of facilitating the solvent to spread in the entire region in the radial direction is desired. For those reasons, this embodiment can be said to be suitable for the form.

Figure 9:
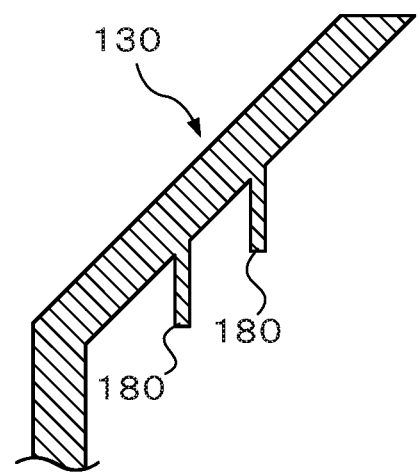
FIG. 9 is a view for explaining another example of the relay unit.
Figure 10:
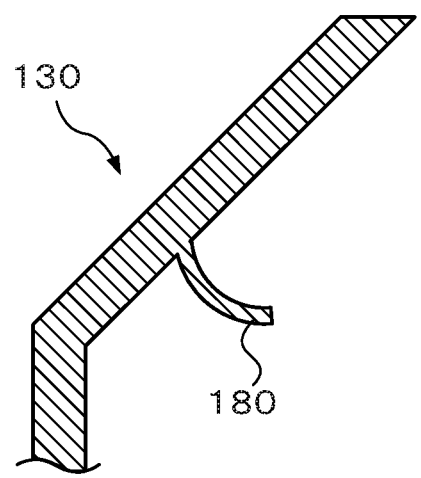
FIG. 10 is a view for explaining still another example of the relay unit.

FIG. 9 and FIG. 10 are views for explaining other examples of the relay unit 180.

In the above-described example, one relay unit 180 is provided, but two relay units 180 may be provided as illustrated in FIG. 9. Note that three or more relay units 180 may be provided. In the case where a plurality of relay units 180 are provided, the relay units 180 are provided such that the lower end of one relay unit 180 is located below, in a side view, the lower end of the other relay unit 180 inside the one relay unit 180.

Besides, the relay unit 180 is formed in a rectangular shape in a cross-sectional view in the above-described example. The shape of the relay unit 180 is not limited to this, but the relay unit 180 may be formed in a downward projecting arc shape in a cross-sectional view, for example, as illustrated in FIG. 10. Making the relay unit 180 in such a shape allows the solvent and the resist solution to drip after being accumulated once at the relay unit 180, thus making it possible to suppress the clogging of the relay unit 180 before cleaning.

Note that it is preferable that the surface on the spin chuck 121 side of the relay unit 180 is hydrophilic. The reason why is that this facilitates the flow of the solvent along the relay unit 180. Further, it is preferable that the surface on the spin chuck 121 side of the relay unit 180 is hydrophilic and the surface on the side opposite to the spin chuck 121 is hydrophobic. The reason why is that this facilitates dripping of the solvent from the tip end of the relay unit 180.

Figure 11:
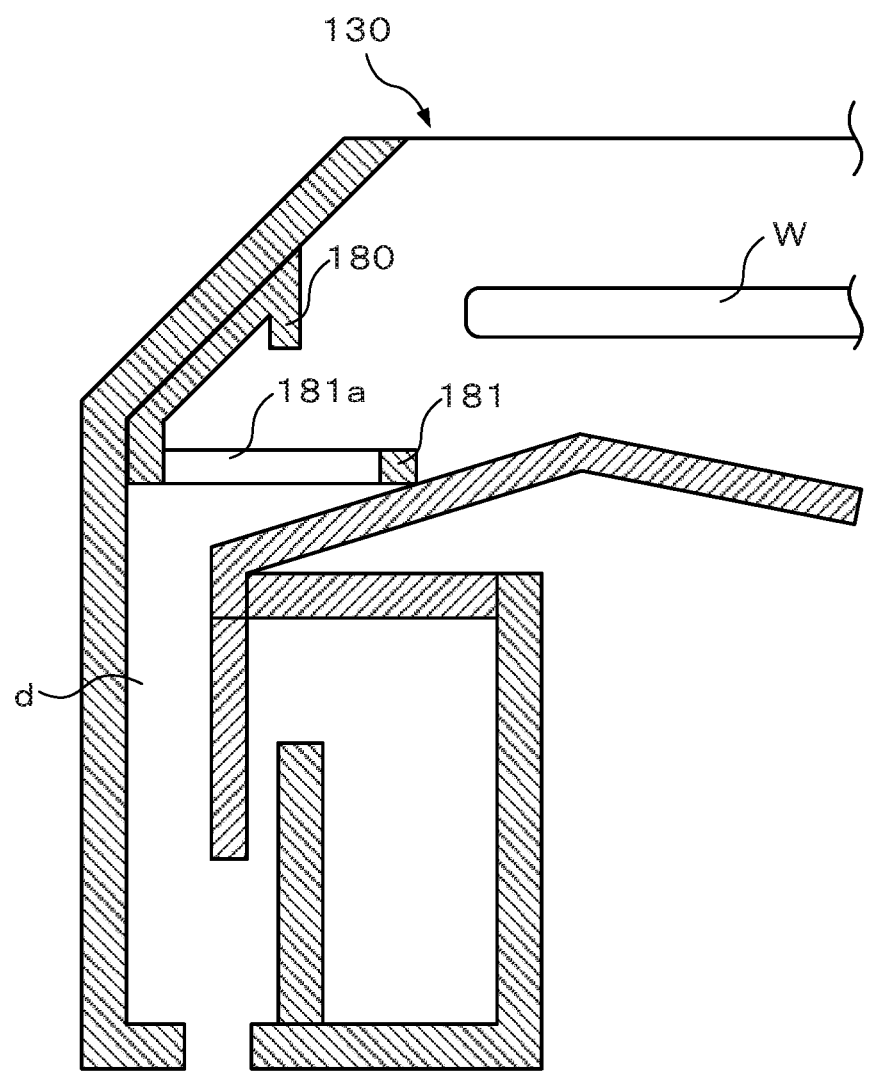
FIG. 11 is a partially enlarged longitudinal sectional view for explaining the outline of another example of the relay unit and the collection member.

FIG. 11 is a partially enlarged longitudinal sectional view for explaining the outline of another example of the relay unit and the collection member.

Though the relay unit 180 is integrally formed with the outer cup 130 and is separate from the collection member 181 in the above example, the relay unit 180 may be integrally provided with the collection member 181 as illustrated in FIG. 11. This allows an existing cup to be used. Note that in this case, the collection member 181 integrally formed with the relay unit 180 is made of, for example, resin. Further, making the collection member 181 dividable, thereby facilitating attachment of the collection member 181 to the cup 125.

Figure 12:
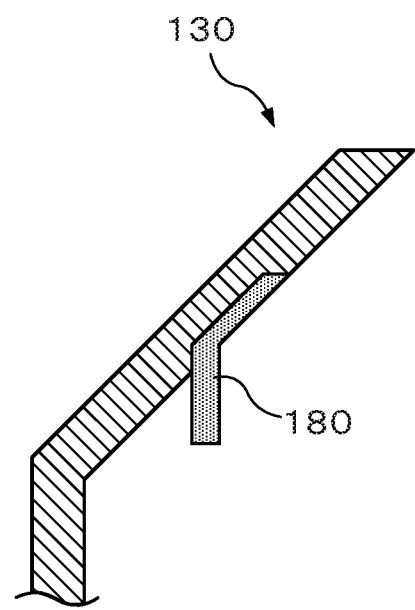
FIG. 12 is a partially enlarged longitudinal sectional view for explaining the outline of another example of the relay unit.

FIG. 12 is a partially enlarged longitudinal sectional view for explaining the outline of another example of the relay unit.

The relay unit 180 is integrally formed with the outer cup 130 in the example of FIG. 4 and so on. However, the relay unit 180 may be formed as a relay member separate from the outer cup 130 as illustrated in FIG. 12. This makes it possible to easily change the length in the vertical direction of the relay unit 180 and to select the length in the vertical direction of the relay unit 180, for example, according to the viscosity of the resist solution.

Though the number of the collection members 181 provided with respect to the exhaust path d is one in the above example, but may be plural.

It should be considered that embodiments disclosed herein are examples only in all respects and are not restrictive. The above embodiments may be simplified, substituted and modified in various forms without departing from the attached scope of claims and the spirit thereof.

For example, the present invention is also applicable to the case where the substrate is a substrate other than the wafer, such as an FPD (Flat Panel Display), a mask reticle for a photomask or the like.

What is claimed is:

1. A solution treatment apparatus for applying a coating solution onto a substrate, the solution treatment apparatus comprising:
    a substrate holding unit configured to hold and rotate the substrate;
    a coating solution supply nozzle configured to apply the coating solution to the substrate held by the substrate holding unit;
    a cup unit arranged outside the substrate holding unit in a manner to be able to surround the substrate held by the substrate holding unit;
    an exhaust path provided between the substrate holding unit and an inner peripheral surface of the cup unit;
    a coating solution collection unit provided above the exhaust path in a manner to cover the exhaust path and comprising an opening part communicating in a vertical direction;
    a solvent supply nozzle configured to supply a solvent for the coating solution to the coating solution collection unit; and
    a relay unit located above the coating solution collection unit and projecting from the inner peripheral surface, which is an inclined surface becoming lower toward an outer side in a radial direction, of the cup unit toward the coating solution collection unit in a gravity direction, wherein
    the relay unit projects directly and linearly, in the gravity direction, from a vertically middle part of the inclined surface of the inner peripheral surface.

2. The solution treatment apparatus according to claim 1, wherein the solvent solution supply nozzle includes a back rinse solution supply nozzle configured to supply the solvent to a back surface of the substrate held by the substrate holding unit for cleaning the back surface, and further comprising:
    a control unit including a computer and a program storage, the computer is configured to control the substrate holding unit and the solvent supply nozzle,
    wherein the computer is configured to control the substrate holding unit and the solvent supply nozzle such that the solvent supplied from the back rinse solution supply nozzle to the back surface of the substrate is shaken off from the rotated substrate, bumps into the relay unit, and is dripped onto the coating solution collection unit.

3. The solution treatment apparatus according to claim 1, wherein a distance between a lower end of the relay unit and the coating solution collection unit is larger than a length in the vertical direction of the relay unit.

4. The solution treatment apparatus according to claim 1, wherein the coating solution collection unit is formed in an annular shape, and
    wherein a lower end of the relay unit is located above an opening formation region being a region of the coating solution collection unit where the opening part is formed in the radial direction.

5. The solution treatment apparatus according to claim 2, wherein a lower end of the relay unit is located below a lower surface of the substrate held by the substrate holding unit so that both the solvent shaken off from an upper surface of the substrate and the solvent shaken off from the back surface of the substrate bumps into the relay unit.

6. The solution treatment apparatus according to claim 1, the coating solution has a viscosity of at least 50 cP, an open area ratio of the coating solution collection unit is 40% or more and 70% or less.

7. The solution treatment apparatus according to claim 1, wherein the coating solution collection unit includes a portion different from the opening part, the portion being formed to linearly link an innermost region and an outermost region in a plan view of the coating solution collection unit.

8. The solution treatment apparatus according to claim 1, wherein the relay unit is integrally formed with the coating solution collection unit.

9. The solution treatment apparatus according to claim 1, wherein the relay unit is formed as a member separate from the cup unit.

* * * * *